US012676625B2

(12) United States Patent　　(10) Patent No.:　US 12,676,625 B2
Araki et al.　　　　　　　　　　　　(45) Date of Patent:　　　Jul. 7, 2026

(54) RECEIVER DEVICE, COMMUNICATION SYSTEM, AND RECEPTION METHOD

(71) Applicant: KIOXIA CORPORATION, Tokyo (JP)

(72) Inventors: Mai Araki, Kawasaki Kanagawa (JP);
Fumihiko Tachibana, Yokohama
Kanagawa (JP)

(73) Assignee: KIOXIA CORPORATION, Tokyo (JP)

( * ) Notice: Subject to any disclaimer, the term of this
patent is extended or adjusted under 35
U.S.C. 154(b) by 51 days.

(21) Appl. No.: 18/601,146

(22) Filed: Mar. 11, 2024

(65) Prior Publication Data

US 2024/0322836 A1　　Sep. 26, 2024

(30) Foreign Application Priority Data

Mar. 20, 2023　(JP) ................................. 2023-044583

(51) Int. Cl.
　　*H03M 1/12*　　　　(2006.01)
　　*H04B 1/16*　　　　(2006.01)
(52) U.S. Cl.
　　CPC ................ *H03M 1/12* (2013.01); *H04B 1/16*
　　　　　　　　　　　　　　　　　　(2013.01)
(58) Field of Classification Search
　　CPC .... H03M 1/12; H03M 1/0609; H03M 1/1028;
　　　　　　　　　　H03M 1/121; H03M 1/1023
　　See application file for complete search history.

(56) References Cited

U.S. PATENT DOCUMENTS 9,584,145 B1 * 2/2017 Shin .................... H03M 1/1028
10,530,379 B1 * 1/2020 Vaz ..................... H03M 1/1215

10,992,501 B1 * 4/2021 Sun .......................... H03L 7/07
11,043,956 B1 6/2021 Wan et al.
11,075,640 B1 * 7/2021 Kang .................... H03M 1/121
　　　　　　　　　(Continued)

FOREIGN PATENT DOCUMENTS

JP　　　H05276036 A　　10/1993
JP　　　20170143411 A　　8/2017
JP　　　2021-175171 A　　11/2021

OTHER PUBLICATIONS

Tangzheng Wu, Na Wang, Jie Wang, Liang Xie and Xiangliang Jin,
A Digital Background Calibration Algorithm of Pipelined ADC
Based on PesudoRandom Sequence , 2019 2nd International Con-
ference on Electronics Technology (Year: 2019).*
　　　　　　　(Continued)

*Primary Examiner* — Aristocratis Fotakis
(74) *Attorney, Agent, or Firm* — Maier & Maier, PLLC

(57)　　　　　　　ABSTRACT

According to one embodiment, a receiver device includes: a
plurality of converters each configured to sample a digital
value from an analog signal, each digital value being
sampled at different timing; and a digital signal processor
configured to calibrate offsets of the digital values. The
plurality of converters include a first converter and a second
converter. The digital signal processor is configured to:
calibrate a first offset caused in the first converter and a
second offset caused in the second converter, in a first
operation using a first analog signal; and calibrate a third
offset that is caused commonly in the first converter for
which the first offset is calibrated and the second converter
for which the second offset is calibrated, in a second
operation using a second analog signal.

14 Claims, 10 Drawing Sheets

(56) References Cited

U.S. PATENT DOCUMENTS

| 11,451,250 | B1 * | 9/2022 | Dedic | ................. | H03M 1/0624 |
| 11,476,876 | B1 * | 10/2022 | Lavery | .................... | H03M 1/10 |
| 2020/0195265 | A1 * | 6/2020 | Ali | ........................... | H03H 7/42 |
| 2020/0235748 | A1 * | 7/2020 | Kang | .................. | H03M 1/1245 |
| 2020/0321971 | A1 * | 10/2020 | Benjaram | ............... | H03M 1/06 |
| 2021/0083683 | A1 * | 3/2021 | Ali | ...................... | H03M 1/0641 |
| 2022/0321135 | A1 * | 10/2022 | Chen | .................. | H03M 1/0836 |

OTHER PUBLICATIONS

Yin Xiumei, Zhao Nan, Sekedi Bomeh Kobenge and Yang Huazhong, Arobust and simple two-mode digital calibration technique for pipelined ADC, vol. 32, No. 3, Journal of Semiconductors, Mar. 2011 (Year: 2011).*

* cited by examiner

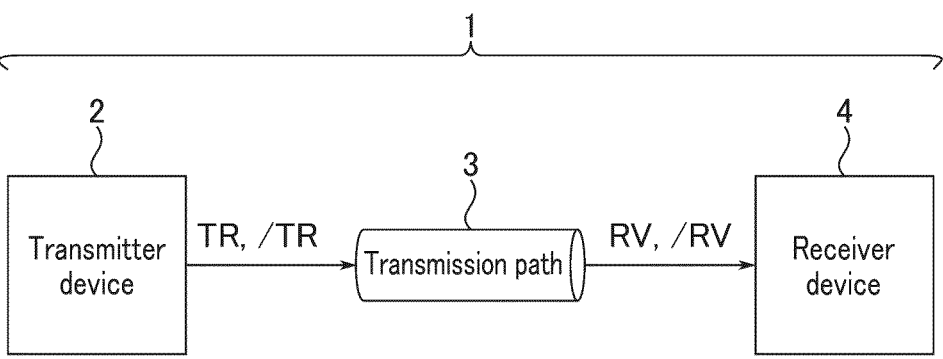
F I G. 1
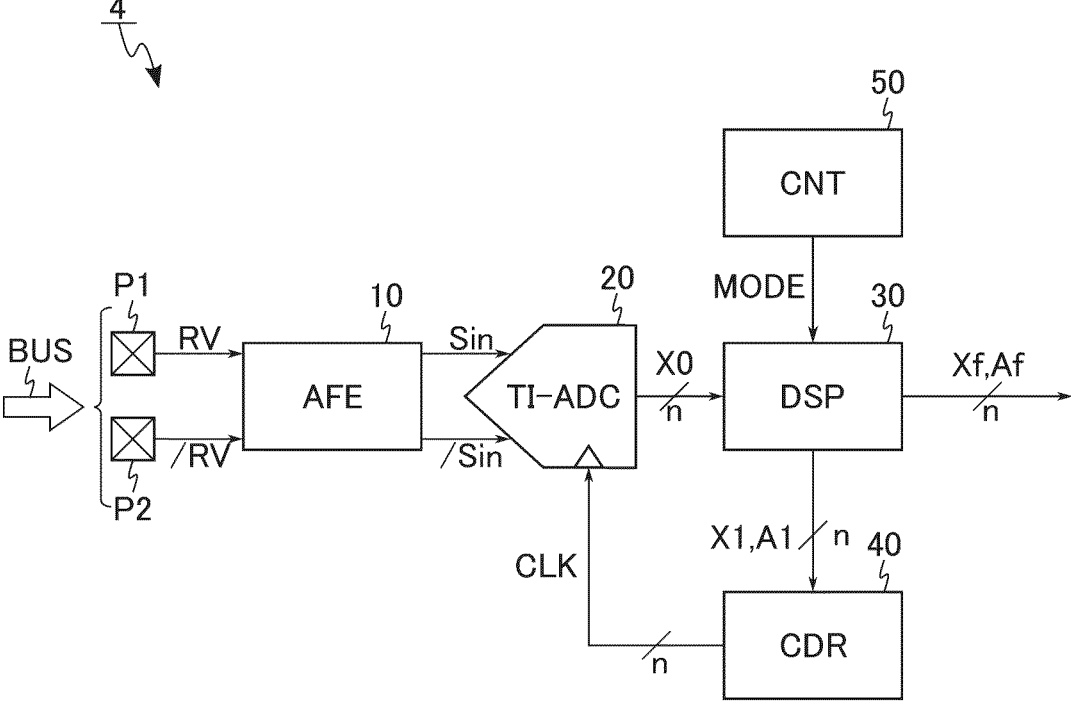
F I G. 2

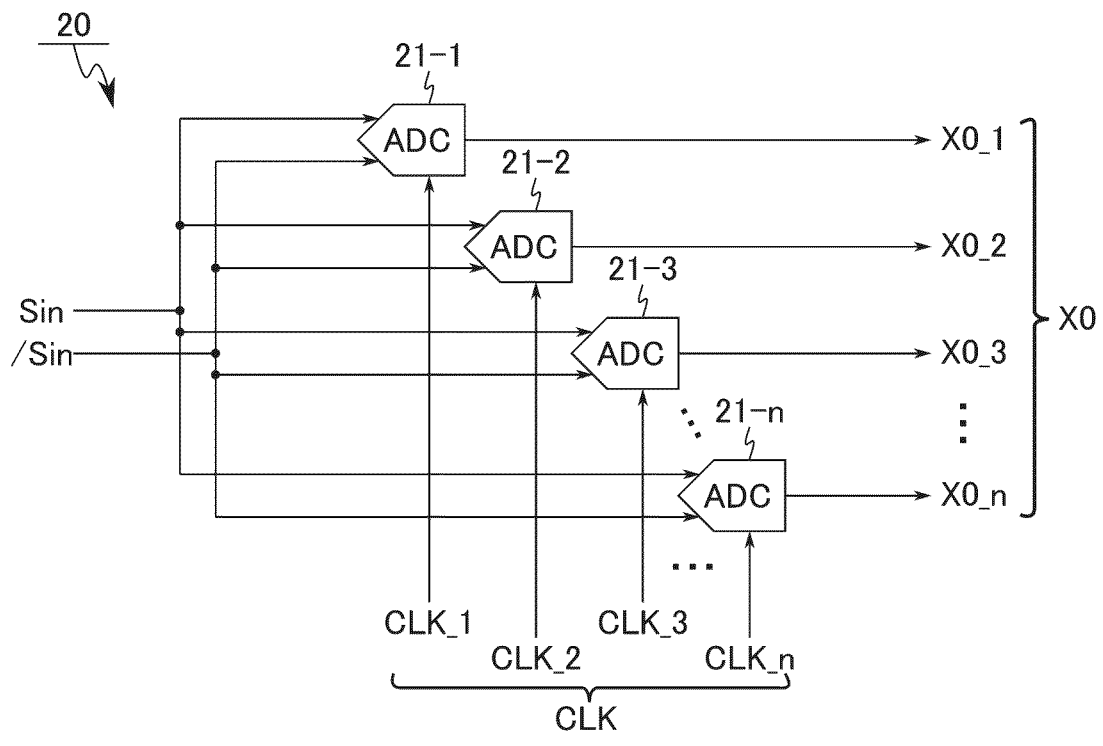
F I G. 3
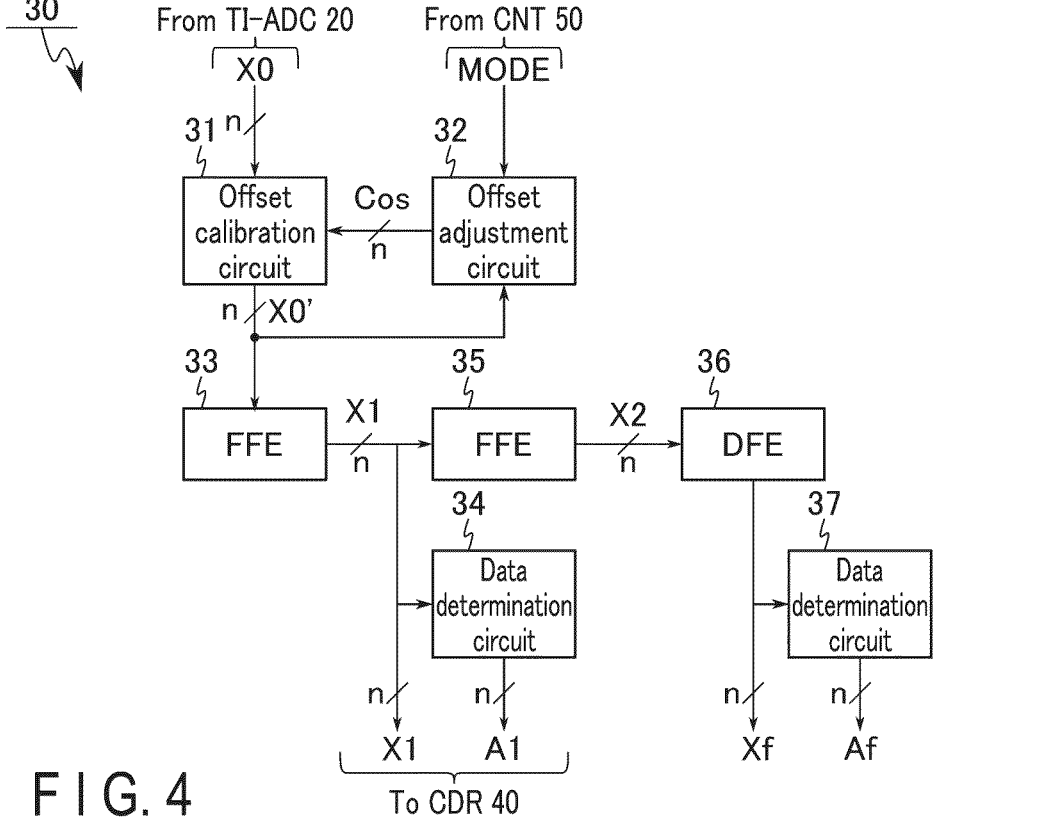
F I G. 4

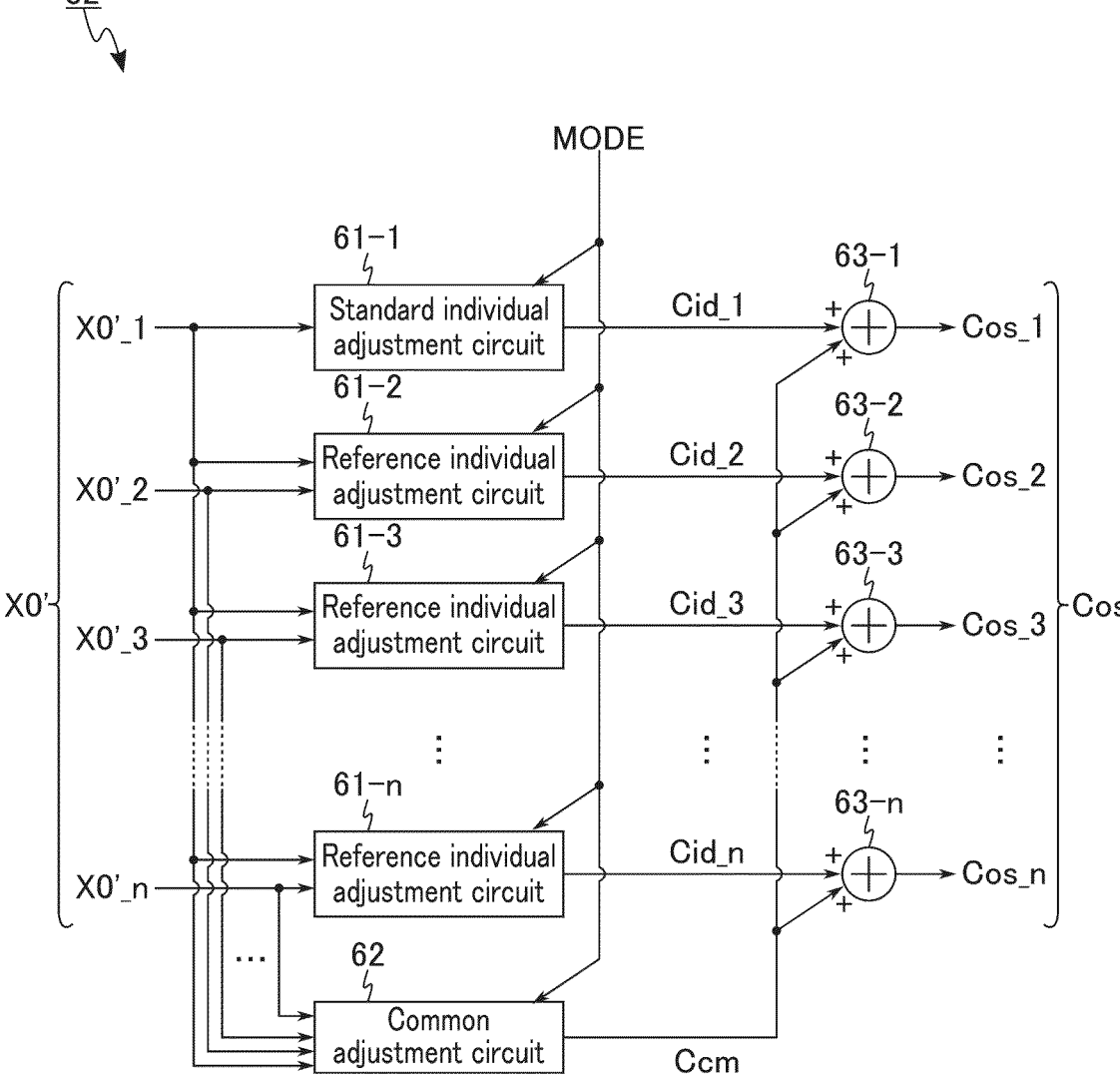
F I G. 5

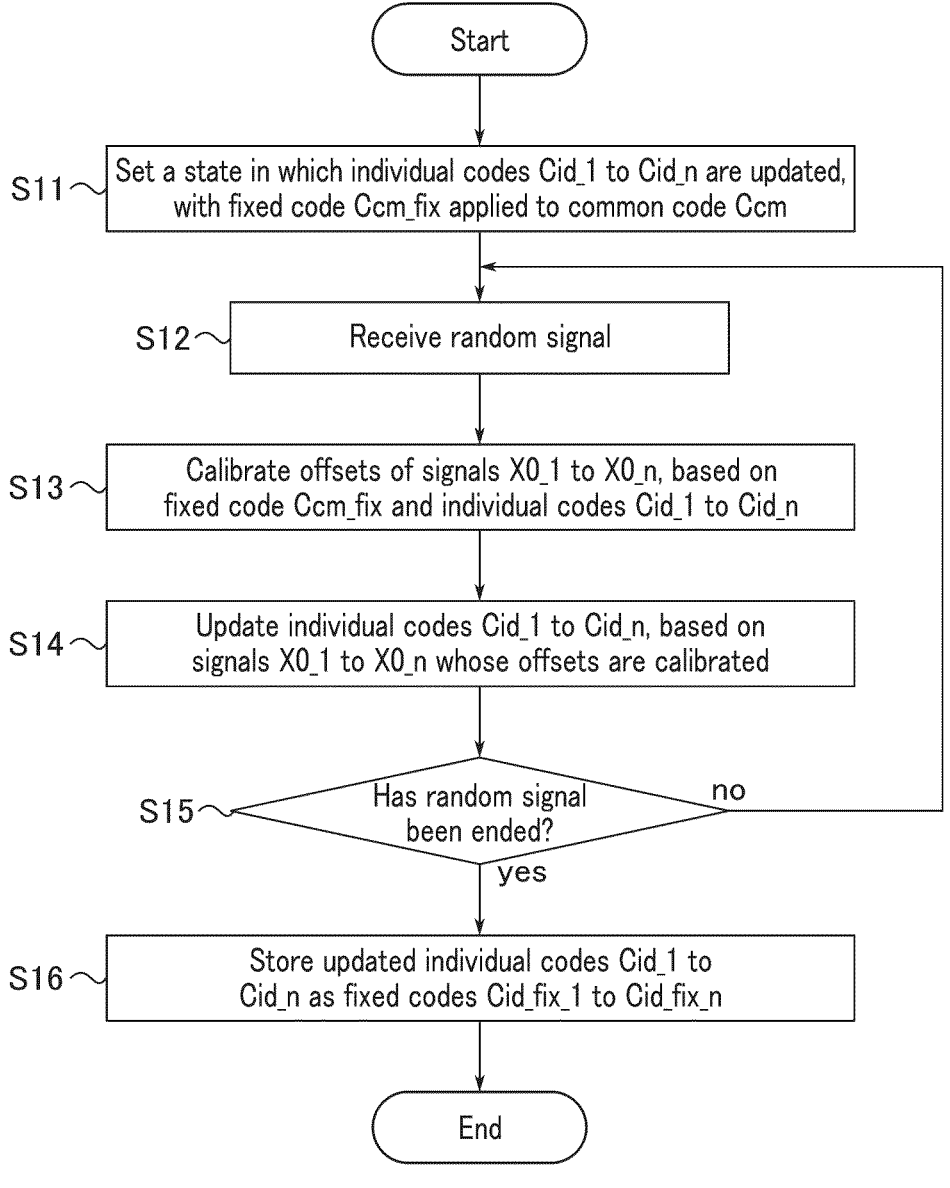

S11 — Set a state in which individual codes Cid_1 to Cid_n are updated, with fixed code Ccm_fix applied to common code Ccm S12 — Receive random signal S13 — Calibrate offsets of signals X0_1 to X0_n, based on fixed code Ccm_fix and individual codes Cid_1 to Cid_n S14 — Update individual codes Cid_1 to Cid_n, based on signals X0_1 to X0_n whose offsets are calibrated S15 — Has random signal been ended?     no yes S16 — Store updated individual codes Cid_1 to Cid_n as fixed codes Cid_fix_1 to Cid_fix_n

F I G. 9

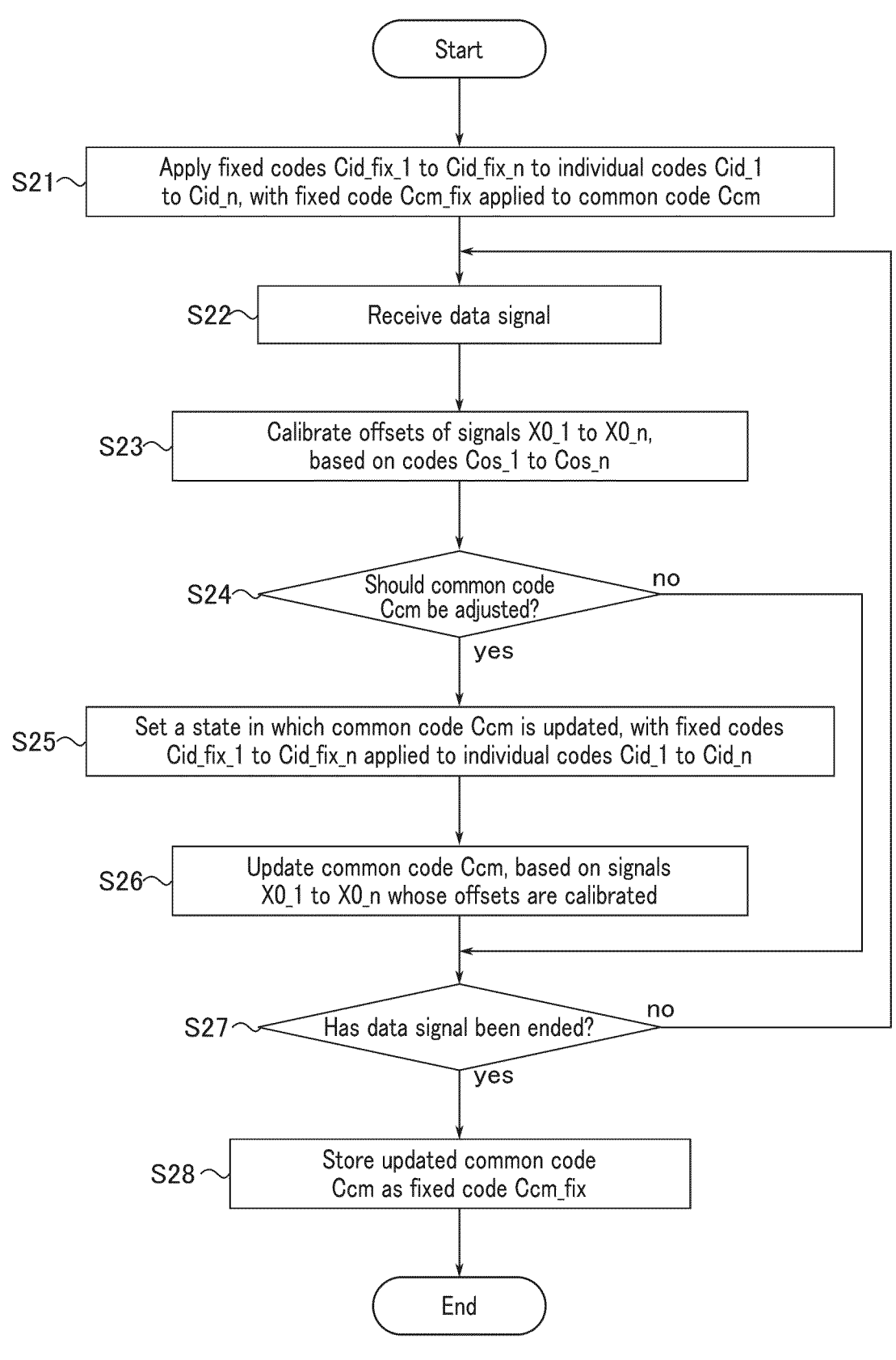

Start

S21 — Apply fixed codes Cid_fix_1 to Cid_fix_n to individual codes Cid_1 to Cid_n, with fixed code Ccm_fix applied to common code Ccm S22 — Receive data signal S23 — Calibrate offsets of signals X0_1 to X0_n, based on codes Cos_1 to Cos_n S24 — Should common code Ccm be adjusted?　no yes S25 — Set a state in which common code Ccm is updated, with fixed codes Cid_fix_1 to Cid_fix_n applied to individual codes Cid_1 to Cid_n S26 — Update common code Ccm, based on signals X0_1 to X0_n whose offsets are calibrated S27 — Has data signal been ended?　no yes S28 — Store updated common code Ccm as fixed code Ccm_fix End

F I G. 10

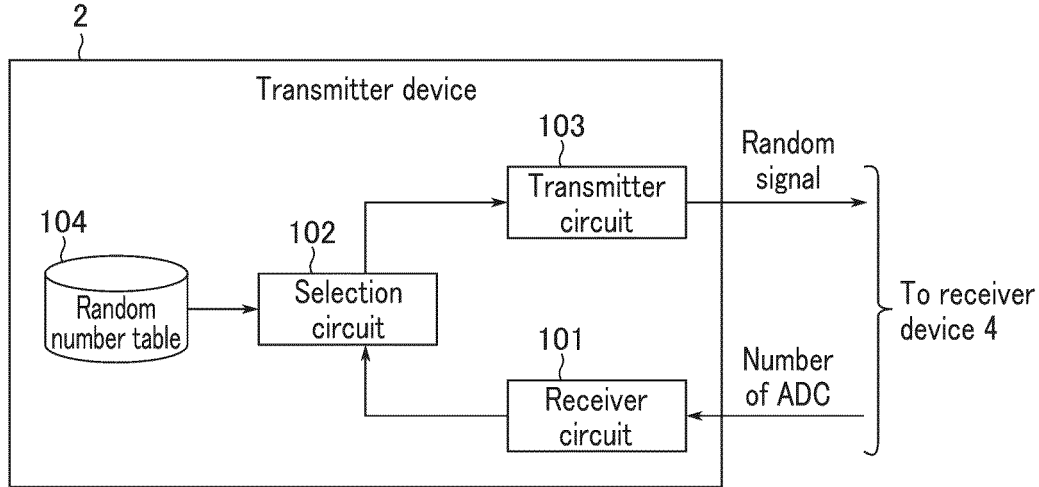
F I G. 11
| Random signal | Pattern length |
|---------------|----------------|
| PRBS7 | 127 |
| ⋮ | ⋮ |
| PRBS15 | 32767 |
| ⋮ | ⋮ |
| PRBS31 | 2147483647 |
F I G. 12

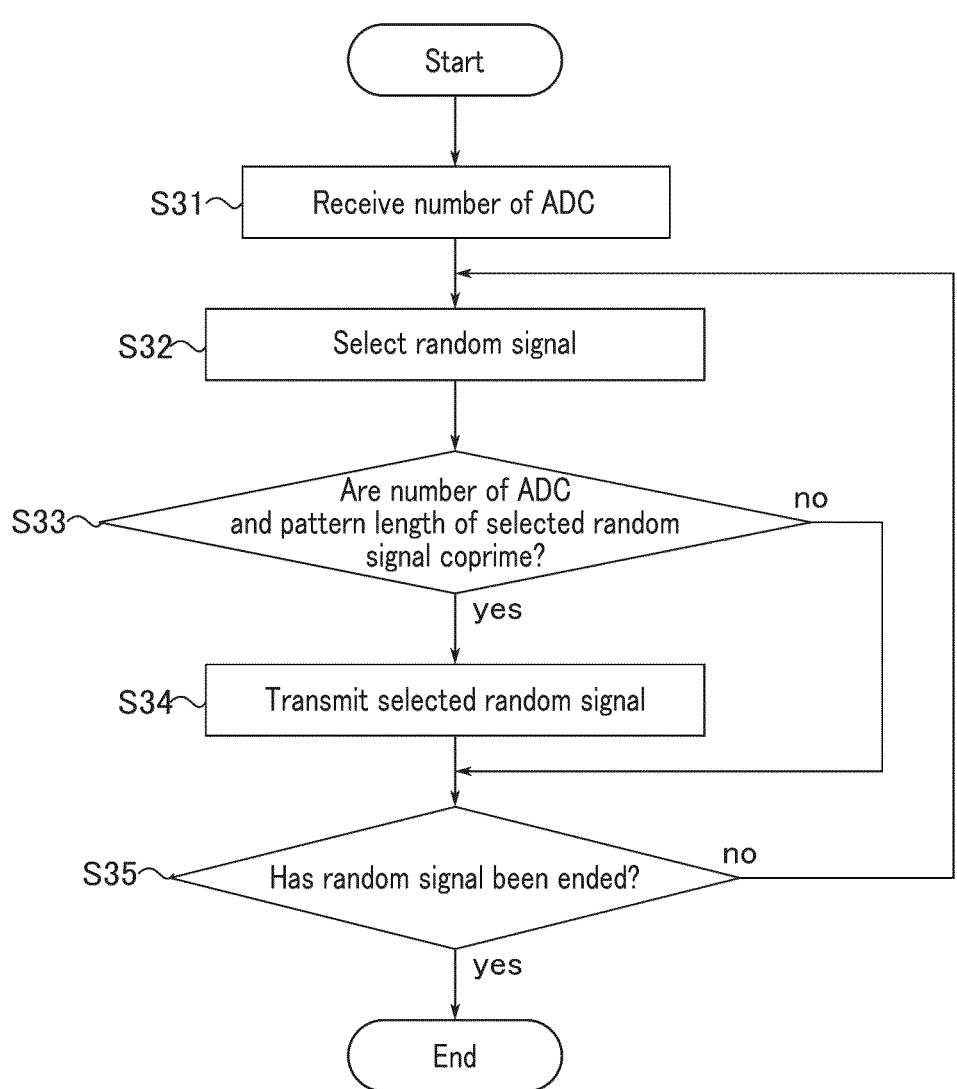
F I G. 13

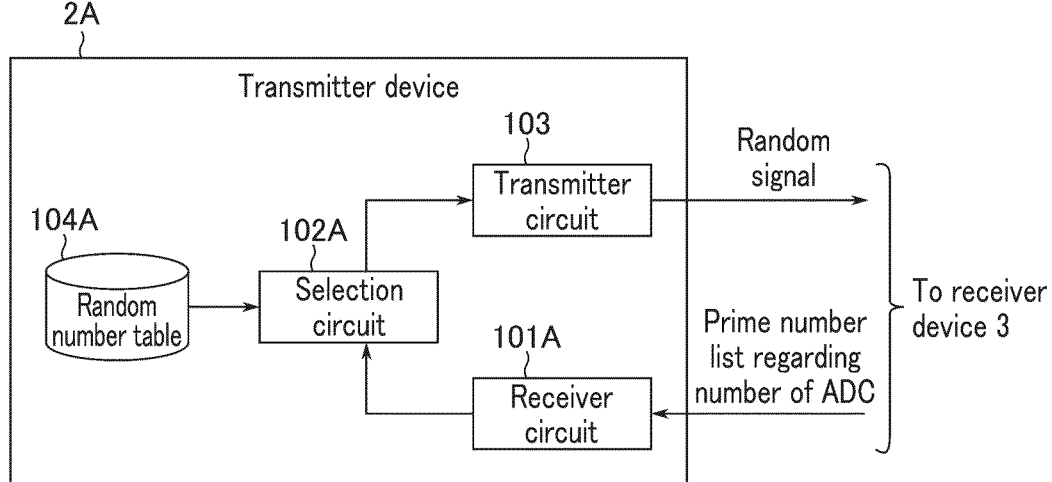
F I G. 14
| Random signal | Prime number list regarding pattern length |
|---|---|
| PRBS7 | {127} |
| ⋮ | ⋮ |
| PRBS15 | {7,31,151} |
| ⋮ | ⋮ |
| PRBS31 | {2147483647} |
F I G. 15

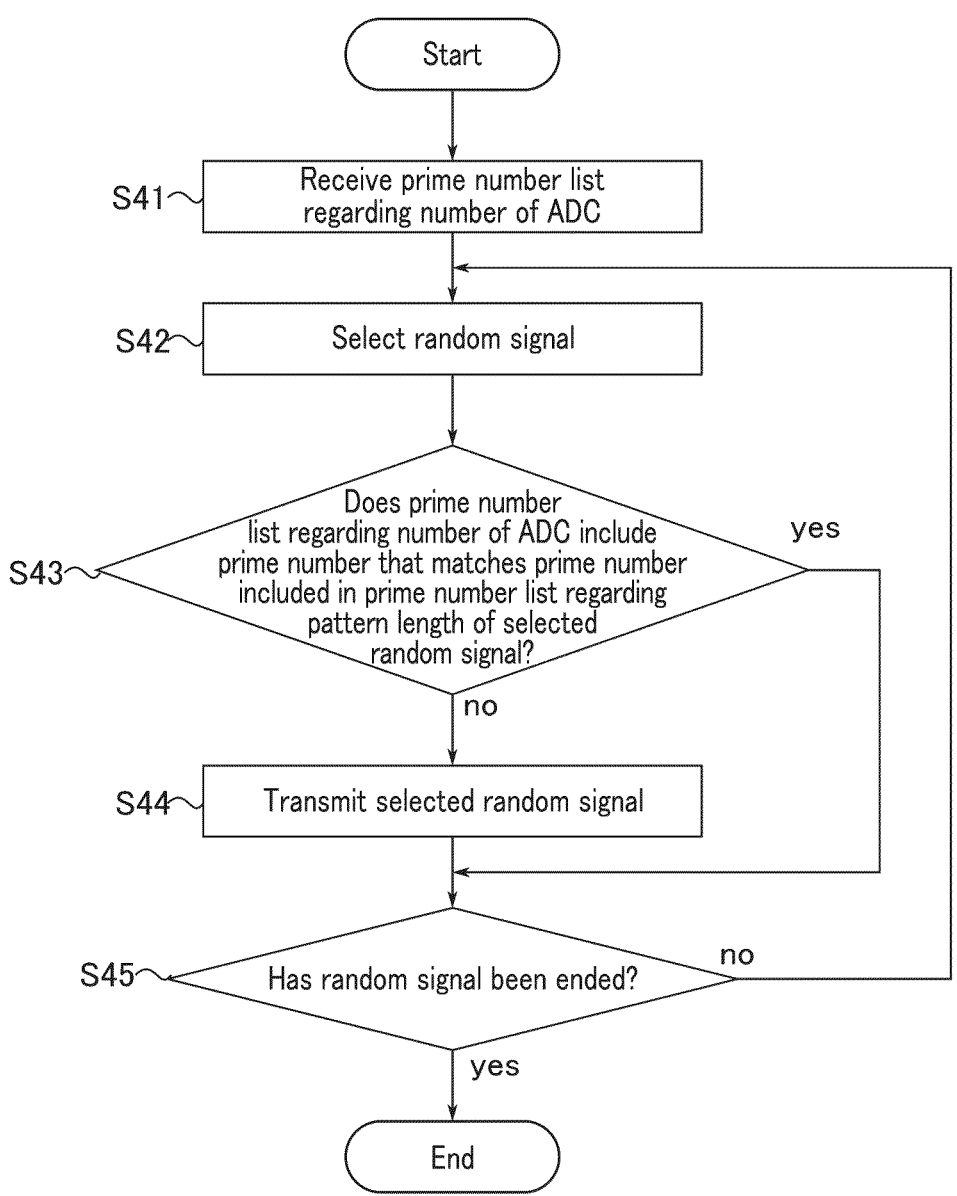
F I G. 16

RECEIVER DEVICE, COMMUNICATION SYSTEM, AND RECEPTION METHOD

CROSS-REFERENCE TO RELATED APPLICATIONS

This application is based upon and claims the benefit of priority from Japanese Patent Application No. 2023-044583, filed Mar. 20, 2023, the entire contents of which are incorporated herein by reference.

FIELD

Embodiments described herein relate generally to a receiver device, a communication system, and a reception method.

BACKGROUND

A transmitter device and a receiver device are coupled via a transmission path. The transmitter device superimposes data on an analog signal. The receiver device receives the analog signal transmitted from the transmitter device and passed through the transmission path. The receiver device includes a receiver circuit that processes the analog signal. The receiver circuit generates a digital signal based on the analog signal. The receiver circuit recovers data based on the generated digital signal.

BRIEF DESCRIPTION OF THE DRAWINGS

FIG. 1 is a block diagram showing an example of a configuration of a communication system including a receiver device according to a first embodiment.

FIG. 2 is a block diagram showing an example of a configuration of a receiver circuit according to the first embodiment.

FIG. 3 is a block diagram showing an example of a configuration of an AD converter included in the receiver circuit of the first embodiment.

FIG. 4 is a block diagram showing an example of a configuration of a digital signal processor included in the receiver circuit of the first embodiment.

FIG. 5 is a block diagram showing an example of a configuration of an offset adjustment circuit included in the receiver circuit of the first embodiment.

FIG. 9 is a flowchart showing an example of a random signal receiving operation including an individual adjustment operation, which is performed in the receiver device of the first embodiment.

FIG. 10 is a flowchart showing an example of a data signal receiving operation including a common adjustment operation, which is performed in the receiver device of the first embodiment.

FIG. 11 is a block diagram showing an example of a configuration of a transmitter device according to a second embodiment.

FIG. 12 is a diagram showing an example of a data structure of a random number table stored in the transmitter device of the second embodiment.

FIG. 13 is a flowchart showing an example of a random signal transmitting operation performed by the transmitter device of the second embodiment.

FIG. 14 is a block diagram showing an example of a configuration of a transmitter device according to a modification of the second embodiment.

FIG. 15 is a diagram showing an example of a data structure of a random number table stored in the transmitter device of the modification of the second embodiment.

FIG. 16 is a flowchart illustrating an example of a random signal transmitting operation performed in the transmitter device of the modification of the second embodiment.

DETAILED DESCRIPTION

Figure 6:
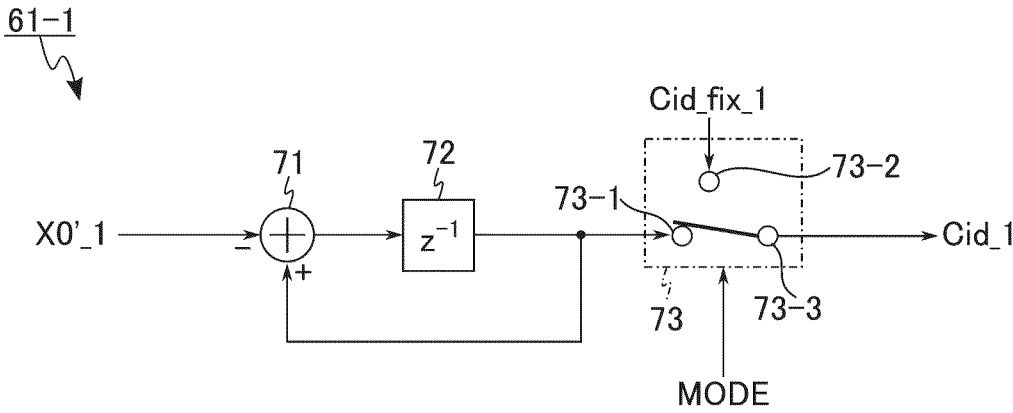
FIG. 6 is a block diagram showing an example of a configuration of a standard individual adjustment circuit included in the offset adjustment circuit of the first embodiment.

In general, according to one embodiment, a receiver device includes: a plurality of converters each configured to sample a digital value from an analog signal, each digital value being sampled at different timing; and a digital signal processor configured to calibrate offsets of the digital values. The plurality of converters include a first converter and a second converter. The digital signal processor is configured to: calibrate a first offset caused in the first converter and a second offset caused in the second converter, in a first operation using a first analog signal; and calibrate a third offset that is caused commonly in the first converter for which the first offset is calibrated and the second converter for which the second offset is calibrated, in a second operation using a second analog signal.

A description will now be given of embodiments with reference to the accompanying drawings.

In the description below, components having the same functions and configurations will be denoted by the same reference symbols. In a case where elements having similar configurations are specifically discriminated from each other, different letters or numerals may be added at the end of the same reference numeral.

1. First Embodiment 1.1 Configuration 1.1.1 Communication System

First of all, a configuration of a communication system including a receiver device of a first embodiment will be described. FIG. 1 is a block diagram showing an example of a configuration of a communication system including a receiver device of a first embodiment.

The communication system 1 is a communication system that realizes, for example, high-speed serial communications of 100 Gbps class. The communication system 1 is configured to transmit data from one device or circuit to another device or circuit. Specifically, the communication system 1 includes a transmitter device 2, a transmission path 3, and a receiver device 4. The communication system 1 may be configured by means of a plurality of devices or circuits provided on the same printed circuit board, or may be configured by means of a plurality of devices or circuits provided on different printed circuit boards.

The transmitter device 2 is configured to transmit signals TR and /TR to the receiver device 4 via the transmission path 3. The signals TR and /TR are differential signals. The signals TR and /TR are, for example, signals including a plurality of pulse signals. Data is superimposed on each pulse signal of the signals TR and /TR. A voltage level of each pulse signal of the signals TR and /TR corresponds to one or more bits of data. Data superimposed on the pulse signal is transmitted from the transmitter device 2 to the receiver device 4 via the transmission path 3.

The transmission path 3 is a physical or spatial transmission medium for transmitting the signals TR and /TR to the receiver device 4. The transmission path 3 is, for example, an interconnect configured to couple the transmitter device 2 and the receiver device 4. The transmission path 3 may have various transmission characteristics, depending on the structure and material of the transmission medium. The transmission characteristics of the transmission path 3 have, for example, a frequency characteristic undergoing a gain loss in a specific frequency band.

The signals TR and /TR transmitted by the transmitter device 2 pass through the transmission path 3 and suffer losses depending on the transmission characteristics of the transmission path 3. Thus, inter-symbol interference (ISI) occurs in the signals TR and /TR passed through the transmission path 3. Therefore, the signals TR and /TR that have passed through the transmission path 3 are processed as analog signals in a first stage circuit of the receiver device 4. In the description below, the signals TR and /TR that have passed through the transmission path 3 and suffered losses will be referred to as signals RV and /RV.

The receiver device 4 is configured to receive the signals RV and /RV from the transmitter device 2 via the transmission path 3. The receiver device 4 decodes the data superimposed on the signals TR and /TR by the transmitter device 2, based on the signals RV and /RV. The receiver device 4 includes a receiver circuit for correctly decoding the data superimposed on the signals TR and /TR.

1.1.2 Receiver Circuit

FIG. 2 is a block diagram showing an example of a configuration of the receiver circuit of the receiver device of the first embodiment.

The receiver circuit of the receiver device 4 includes, for example, pads P1 and P2, an AFE 10, a TI-ADC 20, a DSP 30, a CDR 40, and a CNT 50.

Each of the pads P1 and P2 is a terminal coupled to the transmission path 3. The example in FIG. 2 shows a case where the pads P1 and P2 receive signals RV and /RV, respectively, from the transmitter device 2 via the transmission path 3.

The AFE 10 is an analog front end. The AFE 10 includes, for example, a continuous time linear equalizer (CTLE) and a variable gain amplifier (VGA). The CTLE is an amplifier circuit having frequency characteristics that compensate for the frequency characteristics of the transmission path 3. The VGA is an amplifier circuit, the gain of which can be changed. The signals RV and /RV are input to the AFE 10 from the pads P1 and P2, respectively. The AFE 10 uses the CTLE and the VGA to perform analog processing for the signals RV and /RV. The AFE 10 generates signals Sin and /Sin, based on the signals RV and /RV. That is, like the signals RV and /RV, the signals Sin and /Sin are analog signals. The AFE 10 outputs the signals Sin and/Sin to the TI-ADC 20.

The TI-ADC 20 is a time interleaved AD converter. The TI-ADC 20 receives the signals Sin and /Sin from the analog processing circuit 10 and a signal CLK from the CDR 40. The TI-ADC 20 converts the signals Sin and /Sin into a signal X0, based on the signal CLK. The TI-ADC 20 outputs the signal X0 to the DSP 30.

The signal CLK includes n clock signals. n is an integer equal to 1 or more (for example, 32). The n clock signals of the signal CLK differ in phase by at least 360°/n, for example. In the description below, the n clock signals of the signal CLK may be indicated separately as signals CLK_1, . . . , and CLK_n. A frequency of the signal CLK may be equal to or different from a frequency of clock signals embedded in the signals TR and /TR by the transmitter device 2.

The signal X0 output from the TI-ADC 20 is a digital signal. The signal X0 includes a plurality of consecutive digital values. A bit value of one digital value included in the signal X0 is sampled from one symbol of signals Sin and /Sin, based on one clock signal (specifically, an edge of the clock signal) of the signal CLK. One digital value is, for example, 7-bit data. The value of each bit of the n consecutive digital values included in the signal X0 is sampled from n consecutive symbols of the signals Sin and /Sin, based on n clock signals of the signal CLK. In the description below, a generation cycle of the n consecutive digital values generated by the TI-ADC 20 and included in the signal X0 will be simply referred to as a "cycle." The n consecutive digital values included in the signal X0 will be referred to as a "signal X0 of one cycle" as well. The n consecutive digital values included in the signal X0 may be indicated separately as values X0_1, . . . , and X0_$n$.

The DSP 30 is a digital signal processor as an example of a digital processing circuit. The DSP 30 includes, for example, a feed forward equalizer (FFE), a decision feedback equalizer (DFE), and a data determination circuit. A configuration of the DSP 30 will be described later. The signal X0 is input to the DSP 30. The DSP 30 uses, for example, the FFE, the DFE, and the data determination circuit to perform digital processing for the signal X0. Specifically, the DSP 30 generates signals X1 and Xf and data A1 and Af, based on the signal X0. The DSP 30 outputs the signal X1 and the data A1 to the CDR 40. The DSP 30 outputs the signal Xf and the data Af to a subsequent circuit (not shown). Details of how the signals X1 and Xf and the data A1 and Af are generated will be described later.

The CDR 40 is a clock data recovery circuit. The signal X1 and the data A1 are input to the CDR 40 in each cycle. The CDR 40 calculates a phase correction amount of the signal CLK, based on the signal X1 and the data A1. The CDR 40 recovers the signal CLK, based on the calculated phase correction amount. The CDR 40 outputs the recovered signal CLK to the TI-ADC 20 in each cycle. In this manner, the CDR 40 recovers the signal CLK, which serves as a standard of the sampling timing of the subsequent one cycle of the signal X0, based on the signal X1 and data A1 generated from one cycle of the signal X0. Such cyclic processing which the TI-ADC 20, the DSP 30 and the CDR 40 perform in each cycle will be referred to as a "CDR loop" as well.

The CNT 50 includes, for example, a processor such as a CPU, and a ROM (Read Only Memory). The CNT 50 controls an overall receiver circuit. Specifically, for example, the CNT 50 controls the DSP 30, based on a signal MODE. The signal MODE is a signal that is used to control an operation of the DSP 30 to adjust the voltage level of the signal X0.

1.1.3 AD Converter

Next, a description will be given of an internal configuration of the AD converter (TI-ADC) included in the receiver circuit of the first embodiment. FIG. 3 is a block diagram showing an example of a configuration of the AD converter included in the receiver circuit of the first embodiment.

The TI-ADC 20 includes a plurality of ADCs 21. The plurality of ADCs 21 include n ADCs 21-1, 21-2, 21-3, . . . , and 21-$n$ (n is an integer of 2 or more). Each of the n ADCs 21-1 to 21-$n$ is an AD converter configured to convert an analog signal into a digital signal.

Signals Sin and /Sin are commonly input to the n ADCs 21-1 to 21-$n$. Signals CLK_1 to CLK_n are input to the n ADCs 21-1 to 21-$n$, respectively. The n ADCs 21-1 to 21-$n$ sample values X0_1 to X0_$n$, based on the signals CLK_1 to CLK_n, respectively. In this manner, the n consecutive digital values X0_1 to X0_$n$ included in the signal X0 are sampled by the different ADCs 21-1 to 21-$n$, respectively.

The n ADC-1 to 21-$n$ may have different conversion characteristics. Specifically, for example, in a case where signals TR and /TR are random signals in which an average value of the values transmitted in a certain period is 0, it is desirable that each of average values of the values X0_1 to X0_$n$ output from the n ADCs 21-1 to 21-$n$ can be regarded as 0. However, even if the signals TR and /TR are random signals, each of the average values of the values X0_1 to X0_$n$ output from the n ADCs 21-1 to 21-$n$ may deviate from 0. Further, the average values of the values X0_1 to X0_$n$ output from the n ADCs 21-1 to 21-$n$ may be different from each other. Such a slight deviation in the average values is called an offset as well. Therefore, the subsequent DSP 30 performs adjustment of the offset difference that occurs between the values X0_1 to X0_$n$.

1.1.4 Digital Signal Processor

Next, a description will be given of an internal configuration of the digital signal processor (DSP) included in the receiver circuit of the first embodiment. FIG. 4 is a block diagram showing an example of a configuration of the digital signal processor included in the receiver circuit of the first embodiment.

The DSP 30 includes an offset calibration circuit 31, an offset adjustment circuit 32, an FFE 33, a data determination circuit 34, an FFE 35, a DFE 36, and a data determination circuit 37.

The signal X0 is input to the offset calibration circuit 31 from the TI-ADC 20. In addition, an offset calibration code Cos is input to the offset calibration circuit 31 from the offset adjustment circuit 32. The offset calibration code Cos is a set of n digital values (codes) respectively corresponding to the n digital values included in the signal X0 of one cycle. The offset calibration circuit 31 uses the offset calibration code Cos to perform an offset calibration operation for each of the n digital values included in one cycle of the signal X0. As a result of the offset calibration operation, the offset calibration circuit 31 generates a signal X0' in which the offset of the signal X0 is calibrated in accordance with the offset calibration code Cos. For example, the offset calibration circuit 31 generates a signal X0' by adding n codes included in the offset calibration code Cos to the n digital values included in one cycle of the signal X0. That is, like the signal X0, the signal X0' is a digital signal. The signal X0' corresponding to one cycle is a set of n digital values. The offset calibration circuit 31 outputs the signal X0' to the offset adjustment circuit 32. The signal X0' is further output to the FFE 33.

The signal X0' is input to the offset adjustment circuit 32 from the offset calibration circuit 31. Further, the signal MODE is input to the offset adjustment circuit 32 from the CNT 50. The offset adjustment circuit 32 generates the offset calibration code Cos, based on the signal X0'. The offset calibration code Cos generated by the offset adjustment circuit 32 is output to the offset calibration circuit 31.

Whether or not the offset adjustment circuit 32 updates the offset calibration code Cos is controlled based on the signal MODE. In a case where the offset calibration code Cos is updated, the offset adjustment circuit 32 executes, for example, two types of offset update operations. Switching between the two types of offset update operations is further controlled based on the signal MODE.

In a first type of offset update operation, it is assumed that individual offsets occur in the values X0_1 to X0_$n$ output from the n ADCs 21-1 to 21-$n$. In this case, the offset adjustment circuit 32 updates the offset calibration code Cos such that the offset differences between the values X0_1 to X0_$n$ are eliminated (becomes 0). Specifically, the offset adjustment circuit 32 sets the offset occurring in one of the values X0_1 to X0_$n$ as a standard offset. Then, the offset adjustment circuit 32 adjusts the offsets (reference offsets) occurring in the other (n-1) values to the standard offset. In the description below, the first type of offset update operation will also be referred to as an individual adjustment operation. That is, in the individual adjustment operation, the offset calibration code Cos is updated such that there is no offset difference in each of the n ADCs 21-1 to 21-$n$. It is possible to freely select which offset occurring in the values X0_1 to X0_$n$ is to be used as the standard offset.

In a second type of offset update operation, it is assumed that the same offset (common offset) occurs in the signals X0_1 to X0_$n$ output from the n ADCs 21-1 to 21-$n$. In this case, the offset adjustment circuit 32 updates the offset calibration code Cos such that a common offset commonly occurring in the signals X0_1 to X0_$n$ is eliminated (becomes 0). In the description below, the second type of offset update operation will also be referred to as a common adjustment operation. That is, in the common adjustment operation, the offset calibration code Cos is updated such that, for example, the offset that may commonly occur in the n ADCs 21-1 to 21-$n$ due to changes in the characteristics of the CTLE, VGA, etc. in the AFE 10 can be eliminated.

The signal X0' is input to the FFE 33. The FFE 33 performs arithmetic processing using the digital value to be calculated and the digital values of several symbols before and after the digital value to be calculated, for the n digital values included in the signal X0' of one cycle. The FFE 33 generates a signal X1 as a result of the arithmetic processing. That is, like the signals X0 and X0', the signal X1 is a digital signal. The signal X1 of one cycle is a set of n digital values. The FFE 33 outputs the signal X1 to the data determination circuit 34 and the FFE 35. The signal X1 is further output to the CDR 40.

The signal X1 is input to the data determination circuit 34. Based on the signal X1, the data determination circuit 34 determines the data encoded by the transmitter device 2 as data A1. Specifically, in a case where a PAM 4 is applied to the signals TR and /TR transmitted by the transmitter device 2, the data determination circuit 34 determines 2-bit data for each of the n digital values included in the signal X1 of one cycle. That is, the data A1 has 2 bits of data for each of the n digital values included in the signal X1 of one cycle. The data determination circuit 34 outputs the data A1 to the CDR 40.

The signal X1 is input to the FFE 35. It should be noted that a signal X1' (not shown) that is different from the signal X1 input to the data determination circuit 34 and CDR 40 may be input to the FFE 35. In this case, the signal X1' input to the FFE 35 is generated based on the signal X1. The FFE 35 performs arithmetic processing using the digital value to be calculated and the digital values of several symbols before and after the digital value to be calculated, for each of the n digital values included in the signal X1 of one cycle. The arithmetic processing performed by the FFE 35 may be different from the arithmetic processing performed by the FFE 33. The FFE 35 generates a signal X2 as a result of the arithmetic processing. In other words, like the signals X0, X0', and X1, the signal X2 is a digital signal. The signal X2 of one cycle is a set of n digital values. The FFE 35 outputs the signal X2 to the DFE 36.

The signal X2 is input to the DFE 36. The DFE 36 performs arithmetic processing, based on the digital value to be calculated and the digital values of several symbols before and after the digital value to be calculated, for each of the n digital values included in the signal X2 of one cycle. The DFE 36 generates and outputs a signal Xf as a result of the arithmetic processing. That is, like the signals X0, X0', X1, and X2, the signal Xf is a digital signal. The signal Xf of one cycle is a set of n digital values. The signal Xf generated by the DFE 36 is output to the data determination circuit 37 and subsequent circuits.

The signal Xf is input to the data determination circuit 37. Based on the signal Xf, the data determination circuit 37 determines the data encoded by the transmitter device 2 as data Af. Specifically, in the case where a PAM 4 is applied to the signals TR and /TR transmitted by the transmitter device 2, the data determination circuit 37 determines 2-bit data for each of the n digital values included in the signal Xf of one cycle. The data Af determined by the data determination circuit 37 is output to the subsequent circuit.

1.1.5 Offset Adjustment Circuit

Next, a description will be given of an internal configuration of the offset adjustment circuit included in the receiver circuit of the first embodiment. FIG. 5 is a block diagram showing an example of a configuration of the offset adjustment circuit included in the receiver circuit of the first embodiment. In FIG. 5, the values corresponding to values X0_1 to X0_$n$ of a signal X0' are shown as the values X0'_1 to X0'_$n$, respectively. Codes applied to the values X0'_1 to X0'_$n$ of the offset calibration codes Cos are indicated as codes Cos_1 to Cos_n, respectively. FIG. 5 shows an example in which the offset occurring in the value X0_1 is used as the standard offset.

The offset adjustment circuit 32 includes a standard individual adjustment circuit 61-1, (n-1) reference individual adjustment circuits 61-2, 61-3, . . . , and 61-$n$, a common adjustment circuit 62, and n adder circuits 63-1, 63-2, 63-3, . . . , and 63-$n$.

The value X0'_1 is input to the standard individual adjustment circuit 61-1. The signal MODE is further input to the standard individual adjustment circuit 61-1. The standard individual adjustment circuit 61-1 outputs an individual code Cid_1. The individual code Cid_1 corresponds to an offset (i.e., a standard offset) that occurs individually in the value X0_1. The signal MODE includes a signal for switching whether or not to execute the update operation of the individual code Cid_1 by the standard individual adjustment circuit 61-1.

The Values X0'_2 to X0'_$n$ are input to the reference individual adjustment circuits 61-2 to 61-$n$, respectively. The value X0'_1 and the signal MODE are further input to each of the reference individual adjustment circuits 61-2 to 61-$n$. The reference individual adjustment circuits 61-2 to 61-$n$ output individual codes Cid_2 to Cid_n, respectively. The individual codes Cid_2 to Cid_n correspond to offsets (i.e., reference offsets) that occur individually in the values X0_2 to X0_$n$, respectively. The signal MODE includes a signal for switching whether or not to execute the update operation of the individual codes Cid_2 to Cid_n by the reference individual adjustment circuits 61-2 to 61-$n$.

The values X0'_1 to X0'_$n$ are input to the common adjustment circuit 62. The signal MODE is further input to the common adjustment circuit 62. The common adjustment circuit 62 outputs a common code Ccm. The common code Ccm corresponds to an offset that commonly occurs in the values X0_1 to X0_$n$ (i.e., a common offset). The signal MODE includes a signal for switching whether or not to execute the update operation of the common code Ccm by the common adjustment circuit 62.

The individual codes Cid_1 to Cid_n are input to the adder circuits 63-1 to 63-$n$, respectively. The common code Ccm is further input to each of the adder circuits 63-1 to 63-$n$. The adder circuits 63-1 to 63-$n$ output the sums of the respective individual codes Cid_1 to Cid_n and the common code Ccm as codes Cos_1 to Cos_n.

1.1.6 Standard Individual Adjustment Circuit

Next, a description will be given of an internal configuration of the standard individual adjustment circuit included in the offset adjustment circuit of the first embodiment. FIG. 6 is a block diagram showing an example of a configuration of the standard individual adjustment circuit included in the offset adjustment circuit of the first embodiment. The standard individual adjustment circuit 61-1 includes an adder circuit 71, a delay circuit 72, and a switch 73.

The value X0'_1 and an output value of the delay circuit 72 are input to the adder circuit 71. The adder circuit 71 outputs a value obtained by subtracting the value X0'_1 from the output value of the delay circuit 72.

The output value from the adder circuit 71 is input to the delay circuit 72. The delay circuit 72 delays the output value of the adder circuit 71, for example, by one cycle and outputs the delayed value.

The switch 73 is, for example, a circuit composed of a multiplexer or a transistor. The switch 73 includes a first input terminal 73-1, a second input terminal 73-2, and an output terminal 73-3. The switch 73 is configured to switch the connection with the output terminal 73-3 to either the first input terminal 73-1 or the second input terminal 73-2, depending upon the signal MODE. The output value of the delay circuit 72 is input to the first input terminal 73-1 of the switch 73. A fixed code Cid_fix_1 is input to the second input terminal 73-2 of the switch 73. The individual code Cid_1 calculated by the individual adjustment operation is applied to the fixed code Cid_fix_1. A state in which the first input terminal 73-1 and the output terminal 73-3 of the switch 73 are coupled (a state shown in FIG. 6) corresponds to a state in which the individual adjustment operation is being executed. A state in which the second input terminal 73-2 and the output terminal 73-3 of the switch 73 are coupled corresponds to a state in which the common adjustment operation is being executed or a state in which the offset calibration code Cos_1 is not updated. An output value from the output terminal 73-3 of the switch 73 is output to the adder circuit 63-1 of the offset adjustment circuit 32 as the individual code Cid_1. That is, the individual code Cid_1 is updated based on the value X0'_1 in the case where the individual adjustment operation is performed. In the case where the common adjustment operation is performed or in the case where the offset calibration code Cos_1 is not updated, the individual code Cid_1 is fixed to the fixed code Cid_fix_1.

1.1.7 Reference Individual Adjustment Circuits

Figure 7:
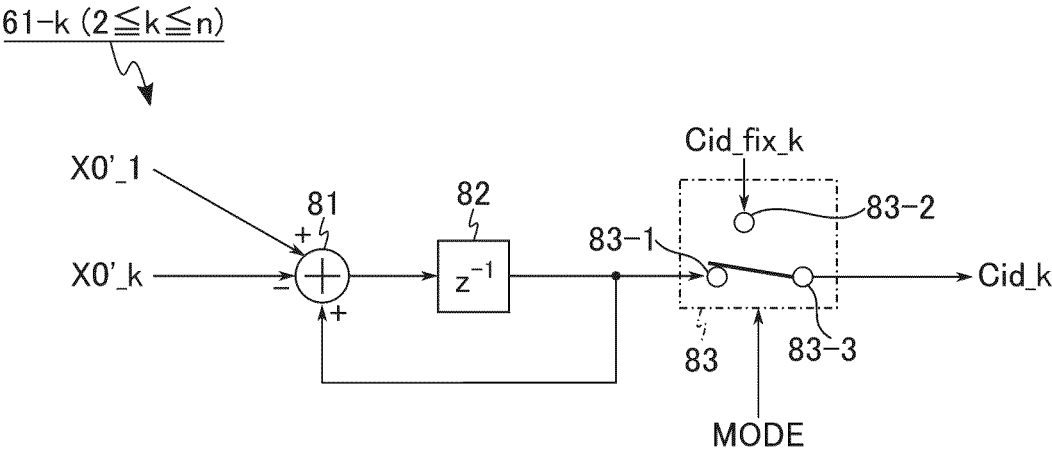
FIG. 7 is a block diagram showing an example of a configuration of a reference individual adjustment circuit included in the offset adjustment circuit of the first embodiment.

Next, a description will be given of an internal configuration of the reference individual adjustment circuits included in the offset adjustment circuit of the first embodiment. FIG. 7 is a block diagram showing an example of a configuration of the reference individual adjustment circuits included in the offset adjustment circuit of the first embodiment.

It should be noted that (n−1) reference individual adjustment circuits 61-2 to 61-$n$ have the same configuration. In FIG. 7, therefore, a configuration of one reference individual adjustment circuit 61-$k$ from among the (n−1) reference individual adjustment circuits 61-2 to 61-$n$ is shown as an example (2≤k≤n). The reference individual adjustment circuit 61-$k$ includes an adder circuit 81, a delay circuit 82, and a switch 83.

Values X0'_1 and X0'_$k$ and an output value of the delay circuit 82 are input to the adder circuit 81. The adder circuit 81 outputs a value obtained by subtracting the value X0'_$k$ from the sum of the value X0'_1 and the output value of the delay circuit 82.

The output value from the adder circuit 81 is input to the delay circuit 82. The delay circuit 82 delays the output value of the adder circuit 81, for example, by one cycle and outputs the delayed value.

The switch 83 is, for example, a circuit composed of a multiplexer or a transistor. The switch 83 includes a first input terminal 83-1, a second input terminal 83-2, and an output terminal 83-3. The switch 83 is configured to switch the connection with the output terminal 83-3 to either the first input terminal 83-1 or the second input terminal 83-2, depending upon the signal MODE. The output value of the delay circuit 82 is input to the first input terminal 83-1 of the switch 83. A fixed code Cid_fix_k is input to the second input terminal 83-2 of the switch 83. An individual code Cid_k calculated by the individual adjustment operation is applied to the fixed code Cid_fix_k. A state in which the first input terminal 83-1 and the output terminal 83-3 of the switch 83 are coupled (a state shown in FIG. 7) corresponds to the state in which the individual adjustment operation is being executed. A state in which the second input terminal 83-2 and the output terminal 83-3 of the switch 83 are coupled corresponds to the state in which the common adjustment operation is being executed or a state in which the offset calibration code Cos_k is not updated. An output value from the output terminal 83-3 of the switch 83 is output to the adder circuit 63-$k$ of the offset adjustment circuit 32 as an individual code Cid_k. That is, the individual code Cid_k is updated based on the values X0'_1 and X0'_$k$ in the case where the individual adjustment operation is performed. In the case where the common adjustment operation is performed or in the case where the offset calibration code Cos_k is not updated, the individual code Cid_k is fixed to the fixed code Cid_fix_k.

1.1.8 Common Adjustment Circuit

Figure 8:
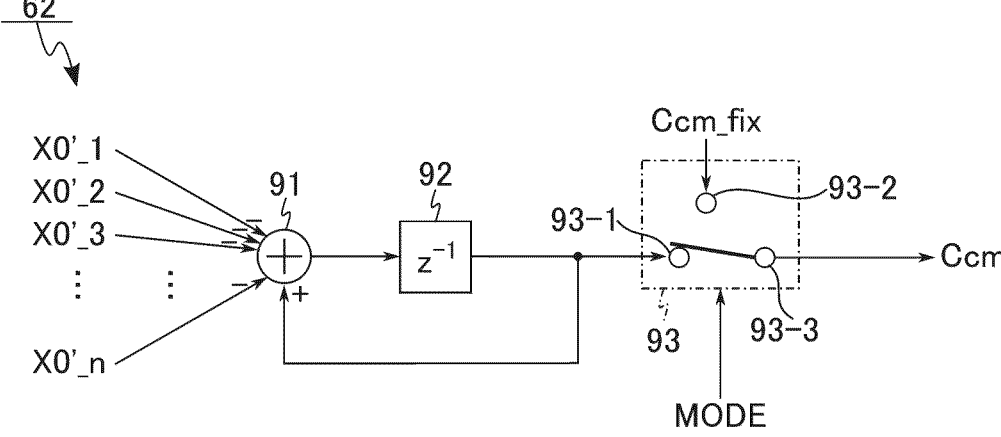
FIG. 8 is a block diagram showing an example of a configuration of a common adjustment circuit included in the offset adjustment circuit of the first embodiment.

Next, a description will be given of an internal configuration of the common adjustment circuit included in the offset adjustment circuit of the first embodiment. FIG. 8 is a block diagram showing an example of a configuration of the common adjustment circuit included in the offset adjustment circuit of the first embodiment. The common adjustment circuit 62 includes an adder circuit 91, a delay circuit 92, and a switch 93.

The Values X0'_1 to X0'_$n$ and an output value of the delay circuit 92 are input to the adder circuit 91. The adder circuit 91 outputs a value obtained by subtracting the sum of the values X0'_1 to X0'_$n$ from the output value of the delay circuit 92.

The output value from the adder circuit 91 is input to the delay circuit 92. The delay circuit 92 delays the output value of the adder circuit 91, for example, by one cycle and outputs the delayed value.

The switch 93 is, for example, a circuit composed of a multiplexer or a transistor. The switch 93 includes a first input terminal 93-1, a second input terminal 93-2, and an output terminal 93-3. The switch 93 is configured to switch the connection with the output terminal 93-3 to either the first input terminal 93-1 or the second input terminal 93-2, depending upon the signal MODE. The output value of the delay circuit 92 is input to the first input terminal 93-1 of the switch 93. A fixed code Ccm_fix is input to the second input terminal 93-2 of the switch 93. An initial value (for example, 0) is applied to the fixed code Ccm_fix. A state in which the first input terminal 93-1 and the output terminal 93-3 of the switch 93 are coupled (a state shown in FIG. 8) corresponds to a state in which the common adjustment operation is being executed. A state in which the second input terminal 93-2 and the output terminal 93-3 of the switch 93 are coupled corresponds to a state in which the individual adjustment operation is being executed or a state in which the offset calibration code Cos is not updated. An output value from the output terminal 93-3 of the switch 93 is output to each of the adder circuits 63-1 to 63-$n$ of the offset adjustment circuit 32 as the common code Ccm. That is, the common code Ccm is updated based on the values X0'_1 to X0'_$n$ in the case where the common adjustment operation is performed. In the case where the individual adjustment operation is performed or in the case where the offset calibration code Cos is not updated, the common code Ccm is fixed to the fixed code Ccm_fix.

1.2 Operation

Next, a description will be given of operations performed by the receiver device 1 of the first embodiment.

1.2.1 Individual Adjustment Operation

First, a description will be given of the individual adjustment operation performed by the receiver device of the first embodiment. FIG. 9 is a flowchart illustrating an example of how a random signal receiving operation including the individual adjustment operation is performed by the receiver device of the first embodiment. The individual adjustment operation is performed during a random signal receiving operation. The random signal receiving operation refers to an operation of receiving a random signal before a data signal receiving operation. The random signal is a signal in which a random number sequence having a pattern length that guarantees an average value of 0 is superimposed. Specifically, the random signal includes a PRBS (Pseudo Random Binary Sequence), for example. The random signal may include a PRQS (Pseudo Random Quaternary Sequence). Unlike the data signal, data to be transmitted to the receiver device 4 is not superimposed on the random signal.

When the random signal receiving operation is started (Start), the CNT 50 of the receiver device 4 sets the offset adjustment circuit 32 to a state in which the individual codes Cid_1 to Cid_n are updated, with the fixed code Ccm_fix applied to the common code Ccm (S11). Specifically, the CNT 50 uses the signal MODE and couples the first input terminal 73-1 and output terminal 73-3 of the switch 73 in the standard individual adjustment circuit 61-1. The CNT 50 uses the signal MODE and couples the first input terminal 83-1 and the output terminal 83-3 of the switch 83 in the reference individual adjustment circuit 61-$k$. The CNT 50 uses the signal MODE and couples the second input terminal 93-2 and the output terminal 93-3 of the switch 93 in the common adjustment circuit 62. Thus, the codes Cos_1 to Cos_n output from the offset adjustment circuit 32 are the sums of the fixed code Ccm_fix and the individual codes Cid_1 to Cid_n, respectively.

After the process in S11, the receiver device 4 receives a random signal (S12).

The offset calibration circuit 31 calibrates the offsets of the signals X0_1 to X0_n, based on the codes Cos_1 to Cos_n calculated from the fixed code Ccm_fix and the individual codes Cid_1 to Cid_n (S13). Specifically, the offset calibration circuit 31 generates signals X0'_1 to X0'_n by adding the codes Cos_1 to Cos_n to the signals X0_1 to X0_n, respectively.

The offset adjustment circuit 32 updates the individual codes Cid_1 to Cid_n, based on the signals X0'_1 to X0'_n generated in the process of S13 (S14). Specifically, the standard individual adjustment circuit 61-1 updates the individual code Cid_1, based on the signal X0'_1. The reference individual adjustment circuit 61-$k$ updates the individual code Cid_k, based on the signals X0'_1 and X0'-k.

The receiver device 4 determines whether the random signal has ended (S15).

If the random signal has not ended (S15; no), the receiver device 4 continues to receive the random signal (S12). Then, the subsequent processes of S13 to S15 are executed. In this manner, the processes of S12 to S15 are repeated until the random signal ends.

If the random signal has ended (S15; yes), the CNT 50 stores the individual codes Cid_1 to Cid_n updated in the process of S14 as fixed codes Cid_fix_1 to Cid_fix_n (S16).

After the process of S16, the random signal receiving operation including the individual adjustment operation ends (End).

1.2.2 Common Adjustment Operation

Next, a description will be given of the common adjustment operation performed in the receiver device of the first embodiment. FIG. 10 is a flowchart showing an example of a data signal receiving operation including the common adjustment operation, which is performed in the receiver device of the first embodiment. The common adjustment operation is performed during the data signal receiving operation. That is, the common adjustment operation is performed after the individual adjustment operation.

When the data signal receiving operation is started (Start), the CNT 50 of the receiver device 4 sets the offset adjustment circuit 32 to a state in which the fixed codes Cid_fix_1 to Cid_fix_n are applied to the individual codes Cid_1 to Cid_n, with the fixed code Ccm_fix applied to the common code Ccm (S21). Specifically, the CNT 50 uses the signal MODE and couples the second input terminal 73-2 and output terminal 73-3 of the switch 73 in the standard individual adjustment circuit 61-1. The CNT 50 uses the signal MODE and couples the second input terminal 83-2 and the output terminal 83-3 of the switch 83 in the reference individual adjustment circuit 61-$k$. The CNT 50 uses the signal MODE and couples the second input terminal 93-2 and the output terminal 93-3 of the switch 93 in the common adjustment circuit 62. Thus, the codes Cos_1 to Cos_n output from the offset adjustment circuit 32 are the sums of the fixed code Ccm_fix and the fixed codes Cid_fix_1 to Cid_fix_n, respectively. That is, the offset adjustment circuit 32 is set in the state in which the offset calibration code Cos is not updated.

After the process of S21, the receiver device 4 receives a data signal (S22).

The offset calibration circuit 31 calibrates the offsets of the signals X0_1 to X0_n, respectively, based on the codes Cos_1 to Cos_n (S23). Specifically, the offset calibration circuit 31 generates signals X0'_1 to X0'_n by adding the codes Cos_1 to Cos_n to the signals X0_1 to X0_n, respectively.

The CNT 50 determines whether or not to adjust the common code Ccm (S24). For example, if it is detected that the characteristics of the CTLE and VGA of the AFE 10 have changed from the characteristics exhibited during the random signal receiving operation, the CNT 50 determines that the common code Ccm should be adjusted. Further, for example, if it is detected that the characteristics of the CTLE and VGA of the AFE 10 have not changed from the characteristics exhibited during the random signal receiving operation, the CNT 50 determines that the common code Ccm should not be adjusted. It should be noted that the common code Ccm may be adjusted at all times when the data signal receiving operation is performed.

If it is determined that the common code Ccm should be adjusted (S24; yes), the CNT 50 sets the offset adjustment circuit 32 to a state where the common code Ccm is updated, with the fixed codes Cid_fix_1 to Cid_fix_n applied to the individual codes Cid_1 to Cid_n (S25). Specifically, the CNT 50 uses the signal MODE and couples the second input terminal 73-2 and output terminal 73-3 of the switch 73 in the standard individual adjustment circuit 61-1. The CNT 50 uses the signal MODE and couples the second input terminal 83-2 and the output terminal 83-3 of the switch 83 in the reference individual adjustment circuit 61-$k$. The CNT 50 uses the signal MODE and couples the first input terminal 93-1 and the output terminal 93-3 of the switch 93 in the common adjustment circuit 62. Thus, the codes Cos_1 to Cos_n output from the offset adjustment circuit 32 are the sums of the fixed codes Cid_fix_1 to Cid_fix_n and the common code Ccm, respectively.

The offset adjustment circuit 32 updates the common code Ccm, based on the signals X0'_1 to X0'_n generated in the process of S23 (S26). Specifically, the common adjustment circuit 62 updates the common code Ccm, based on the signals X0'_1 to X0'_n, which are signals obtained by calibrating the offsets of the signals X0_1 to X0_n.

The receiver device 4 determines whether the data signal has ended (S27).

If the data signal has not ended (S27; no), the receiver device 4 continues to receive the data signal (S22). Then, the subsequent processes of S23 to S27 are executed. In this manner, the processes of S22 to S27 are repeated until the data signal ends.

If the data signal has ended (S27; yes), the CNT 50 stores the common code Ccm updated in the process of S26 as the fixed code Ccm_fix (S28).

After the process of S28, the data signal receiving operation including the common adjustment operation ends (End).

1.3 Advantages of First Embodiment

According to the first embodiment, in the individual adjustment operation, the standard individual adjustment circuit 61-1 calculates the individual code Cid_1, based on the value X0'_1. The reference individual adjustment circuit 61-$k$ calculates the individual code Cid_k, based on the difference between the values X0'_1 and X0'_k. Thus, the offset calibration circuit 31 can calibrate offsets that occur individually in the values X0_1 to X0_n due to the ADCs 21_1 to 21_n, respectively, using the individual codes Cid_1 to Cid_n. Therefore, occurrence of mutually different offsets can be suppressed between the values $X0'\_1$ to $X0'\_n$. Accordingly, deterioration of reception characteristics can be suppressed.

Furthermore, in the common adjustment operation, the common adjustment circuit 62 calculates the common code Ccm, based on the sum of the values $X0'\_1$ to $X0'\_n$. Thus, the offset calibration circuit 31 can calibrate by using the common code Ccm, the offset that commonly occurs in the values $X0\_1$ to $X0\_n$ in accordance with changes in the characteristics of the circuits preceding the TI-ADC 20, such as the CTLE and VGA of the AFE 10. Thus, the occurrence of an offset common to the values $X0'\_1$ to $X0'\_n$ can be suppressed. Accordingly, deterioration of reception characteristics can be suppressed.

Additionally, the individual adjustment operation is performed in response to the reception of a random signal. This prevents occurrence of offsets caused by the received signal. In the individual adjustment operation, therefore, accurate calibration is enabled for offsets that occur individually in the values $X0\_1$ to $X0\_n$ due to the ADCs 21\_1 to 21\_n.

The common adjustment operation is performed in response to the reception of a data signal. This allows the offset calibration code Cos to follow in response to how characteristics change during an actual operation.

Further, the individual adjustment operation is executed, with the fixed code Ccm_fix applied to the common code Ccm. The common adjustment operation is performed, with the individual codes Cid\_1 to Cid\_n calculated by the individual adjustment operation being applied as fixed codes Cid_fix\_1 to Cid_fix\_n. Thus, an offset that commonly occurs in the values $X0\_1$ to $X0\_n$ and an offset that individually occurs in the values $X0\_1$ to $X0\_n$ can be calculated separately.

2. Second Embodiment

Next, a description will be given of a second embodiment. The second embodiment differs from the first embodiment in that a pattern length of a random signal is determined based on information provided from the receiver device. In the following, a description will be given mainly of the configurations and operations differentiating the second embodiment from the first embodiment. As for the configurations and operations common to the first embodiment, a description of them will be omitted.

2.1 Transmitter Device

FIG. 11 is a block diagram showing an example of a configuration of a transmitter device according to a second embodiment. The transmitter device 2 includes a receiver circuit 101, a selection circuit 102, and a transmitter circuit 103. The transmitter device 2 stores a random number table 104.

The receiver circuit 101 receives information from the receiver device 4. Specifically, the receiver circuit 101 receives the number of ADCs 21 (the number of ADC) included in the TI-ADC 20 from the receiver device 4. It should be noted that the communications between the receiver circuit 101 and the receiver device 4 do not have to be high-speed serial communications using the transmission path 3.

The selection circuit 102 refers to the random number table 104 and calculates the greatest common divisor of the number of ADC n and the pattern length of a random signal candidate used in a random signal receiving operation. The selection circuit 102 selects a random signal that enables the calculated greatest common divisor to be 1 (that is, a random signal having a pattern length which is coprime to the number of ADC n) as a random signal used in the random signal receiving operation.

In the random signal receiving operation, the transmitter circuit 103 transmits the random signal having the pattern length selected by the selection circuit 102 to the receiver device 4. The communications between the transmitter circuit 103 and the receiver device 4 are high-speed serial communications using the transmission path 3.

FIG. 12 is a diagram showing an example of a data structure of the random number table stored in the transmitter device of the second embodiment. In the random number table 104, random signals that may be used for an individual adjustment operation of the receiver device 4 and pattern lengths corresponding to the random signals are stored in association with each other. The pattern lengths stored in the random number table 104 correspond to the lengths of random number sequences ensuring that the average values of the corresponding random signals are 0.

In the example of FIG. 12, for example, the pattern lengths of the random signals PRBS7, . . . , PRBS15, . . . , and PRBS31 are 127, . . . , 32767, . . . , and 2147483647, respectively. It should be noted that the random number table 104 may store a case where a PRQS is applied to random signals. In this case, the pattern length of the random signal PRQS(N) is equal to PRBS (2N) (N is a natural number).

By referring to the random number table 104, the selection circuit 102 can determine which random signal having a certain pattern length should be used for the individual adjustment operation.

2.2 Random Signal Transmitting Operation

FIG. 13 is a flowchart showing an example of a random signal transmitting operation performed by the transmitter device according to the second embodiment.

When the random signal transmitting operation is started (Start), the receiver circuit 101 of the transmitter device 2 receives the number of ADC n from the receiver device 4 (S31).

The selection circuit 102 of the transmitter device 2 selects a random signal from the random number table 104 as a random signal candidate for use in the individual adjustment operation (S32).

The selection circuit 102 determines whether the number of ADC n received in the process of S31 and the pattern length of the random signal selected in the process of S32 are coprime (S33).

In a case where the number of ADC n and the pattern length of the random signal are coprime (S33; yes), the selection circuit 102 determines that the random signal selected in the process of S32 is a random signal that can be used for the individual adjustment operation. The transmitter circuit 103 transmits the random signal selected in the process of S32 to the receiver device 4 via the transmission path 3 (S34).

In a case where the number of ADC n and the pattern length of the random signal are not coprime (S33; no), the selection circuit 102 determines that the random signal selected in the process of S32 is a random signal that cannot be used for the individual adjustment operation. If "no" is determined in the process of S33, or after the process of S34, the transmitter device 2 determines whether or not the transmission of the random signal has ended (S35). If "no" is determined in the process of S33, the transmitter device 2 may execute the process of S32 without executing the process of S35.

In a case where the transmission of the random signal has not been completed (S35; no), the selection circuit 102 selects an unselected random signal from the random number table 104 as a random signal candidate for use in the individual adjustment operation (S32). Then, the subsequent processes of S33 to S35 are executed. In this manner, the processes of S32 to S35 are executed until the transmission of the random signal ends.

In a case where the transmission of the random signal has ended (S35; yes), the random signal transmitting operation ends (End).

2.3 Advantages of Second Embodiment

In a case where the pattern length of a random signal and the number of ADC n are not coprime, each of the ADCs 21-1 to 21-$n$ can receive only part of the patterns whose average values are guaranteed to be 0 in the random signal. Thus, even if the average value of the random signal itself is 0, the average value of each of the values X0'_1 to X0'_$n$ may not be 0. If an individual adjustment operation is performed for such a signal, an offset caused by a characteristic difference between the ADCs 21_1 to 21_$n$ and an offset caused by the signal cannot be distinguished from each other. Therefore, the accuracy of the individual codes Cid_1 to Cid_n may deteriorate, which is not preferable.

According to the second embodiment, the receiver circuit 101 of the transmitter device 2 receives the number of ADC n from the receiver device 4. The selection circuit 102 selects a random signal such that the number of ADC n and the pattern length of the random signal used in the individual adjustment operation are coprime. Thus, each of the ADCs 21-1 to 21-$n$ can receive all patterns whose average values are guaranteed to be 0 in the random signal. Therefore, the individual adjustment operation can be performed in a state where the average value of each of the values X0'_1 to X0'_$n$ is guaranteed to be 0. Accordingly, deterioration in the accuracy of the individual codes Cid_1 to Cid_n calculated in the individual adjustment operation can be suppressed.

2.4 Modification of Second Embodiment

In the second embodiment described above, it was described as the example in the case where the random signal used for the individual adjustment operation is determined based on the number of ADC n, but embodiment is not restrictive. For example, the random signal used for the individual adjustment operation may be determined based on a prime number list transmitted from the receiver device 4. In the following, a description will be given mainly of the configurations and operations differentiating the modification from the second embodiment. As for the configurations and operations common to the second embodiment, a description of them will be omitted.

2.4.1 Transmitter Device

FIG. 14 is a block diagram showing an example of a configuration of a transmitter device according to a modification of the second embodiment. FIG. 14 corresponds to FIG. 11 referred to in connection with the second embodiment. The transmitter device 2A of the modification of the second embodiment includes a receiver circuit 101A, a selection circuit 102A, and a transmitter circuit 103. The transmitter device 2A stores a random number table 104A.

The receiver circuit 101A receives information from the receiver device 4. Specifically, the receiver circuit 101A receives a prime number list regarding the number of ADC n from the receiver device 4. The prime number list regarding the number of ADC n includes prime numbers which are prime factors of the number of ADC n and which are other than 2. For example, in a case where the number of ADC n is 30 (=2×3×5), the receiver circuit 101A receives {3, 5} as the prime number list regarding the number of ADC n.

The selection circuit 102A refers to the random number table 104A and compares the prime number list regarding the number of ADC n with the prime number list regarding the pattern length of a random signal candidate used in the random signal receiving operation. If the result of the comparison shows that the prime number list regarding the number of ADC n does not include a prime number that would match a prime number included in the prime number list regarding the pattern length, then the selection circuit 102A selects the random signal candidate as a random signal used in the random signal receiving operation.

In the random signal receiving operation, the transmitter circuit 103 transmits a random signal having the pattern length selected by the selection circuit 102A to the receiver device 4.

FIG. 15 is a diagram showing an example of a data structure of a random number table stored in the transmitter device according to the modification of the second embodiment. In the random number table 104A, random signals that may be used for an individual adjustment operation of the receiver device 4 and a prime number list regarding pattern lengths corresponding to the random signals are stored in association with each other. The prime number list regarding the pattern lengths includes prime numbers which are prime factors of a pattern length and which are other than 2.

In the example of FIG. 15, for example, the prime number list regarding the pattern length of the random signal PRBS7 is {127}. The prime number list regarding the pattern length of the random signal PRBS15 is {7, 31, 151}. The prime number list regarding the pattern length of the random signal PRBS31 is {2147483647}. It should be noted that the random number table 104A may store a case where a PRQS is applied to random signals.

By referring to the random number table 104A, the selection circuit 102A can determine which random signal having a certain pattern length should be used for the individual adjustment operation.

2.4.2 Random Signal Transmitting Operation

FIG. 16 is a flowchart showing an example of a random signal transmitting operation performed by the transmitter device according to the modification of the second embodiment.

When the random signal transmitting operation is started (Start), the receiver circuit 101A of the transmitter device 2A receives a prime number list regarding the number of ADC n from the receiver device 4 (S41).

The selection circuit 102A of the transmitter device 2A selects a random signal from the random number table 104A as a random signal candidate for use in the individual adjustment operation (S42).

The selection circuit 102A determines whether or not the prime number list regarding the number of ADC n received in the process of S41 includes a prime number that matches a prime number included in the prime number list regarding the pattern length of the random signal selected in the process of S42 (S43).

In a case where the prime number list regarding the number of ADC n does not include a prime number that matches the prime number included in the prime number list regarding the pattern length of the random signal (S43; no), the selection circuit 102A determines that the random signal selected in the process of S42 is a random signal that can be used for the individual adjustment operation. The transmitter circuit 103 transmits the random signal selected in the process of S42 to the receiver device 4 via the transmission path 3 (S44).

In a case where the prime number list regarding the number of ADC n includes a prime number that matches the prime number included in the prime number list regarding the pattern length of the random signal (S43; yes), the selection circuit 102A determines that the random signal selected in the process of S42 is a random signal that cannot be used for the individual adjustment operation. If "yes" is determined in the process of S43, or after the process of S44, the transmitter device 2A determines whether or not the transmission of the random signal has ended (S45). If "yes" is determined in the process of S43, the transmitter device 2A may execute the process of S42 without executing the process of S45.

In a case where the transmission of the random signal has not been completed (S45; no), the selection circuit 102A selects an unselected random signal from the random number table 104A as a random signal candidate for use in the individual adjustment operation (S42). Then, the subsequent processes of S43 to S45 are executed. In this manner, the processes of S42 to S45 are executed until the transmission of the random signal ends.

In a case where the transmission of the random signal has ended (S45; yes), the random signal transmitting operation ends (End).

2.4.3 Advantages of Modification of Second Embodiment

According to the modification of the second embodiment, the receiver circuit 101A of the transmitter device 2A receives a prime number list regarding the number of ADC n from the receiver device 4. The selection circuit 102A selects a random signal such that the prime number list regarding the number of ADC n does not include a prime number that matches a prime number included in the prime number list regarding the pattern length of the random signal used in the individual adjustment operation. Thus, each of the ADCs 21-1 to 21-*n* can receive all patterns whose average values are guaranteed to be 0 in the random signal. Therefore, the individual adjustment operation can be performed in a state where the average value of each of the values X0'_1 to X0'_*n* is guaranteed to be 0. Accordingly, deterioration in the accuracy of the individual codes Cid_1 to Cid_n calculated in the individual adjustment operation can be suppressed as in the second embodiment.

While certain embodiments have been described, these embodiments have been presented by way of example only, and are not intended to limit the scope of the invention. Indeed, the embodiments described herein may be embodied in a variety of other forms; furthermore, various omissions, substitutions and changes in the form of the embodiments described herein may be made without departing from the spirit of the inventions. The embodiments and modifications are included in the scope and spirit of the invention and are included in the scope of the claimed inventions and their equivalents.

What is claimed is:

1. A receiver device comprising:
a plurality of converters each configured to sample a digital value from an analog signal, each digital value being sampled at different timing; and
a digital signal processor configured to calibrate offsets of the digital values,
wherein
the plurality of converters include a first converter and a second converter, and the digital signal processor is configured to:
perform to calibrate a first offset caused in the first converter and a second offset caused in the second converter, in a first operation using a first analog signal that is input to the first converter and the second converter; and
perform to calibrate a third offset that is caused commonly in the first converter for which the first offset is calibrated and the second converter for which the second offset is calibrated, in a second operation using a second analog signal that is different from the first analog signal, the second analog signal being input to the first converter and the second converter after the first operation, and wherein
the first analog signal includes a random signal,
the second analog signal includes a data signal different from the random signal, and
a pattern length of the random signal and a number of the plurality of converters are coprime.

2. The receiver device according to claim 1, wherein
the digital signal processor is further configured to:
perform no calibration of the third offset in the first operation; and
perform no calibration of the first offset and no-calibration of the second offset in the second operation.

3. The receiver device according to claim 1, wherein
in the first operation,
the first converter is configured to sample a first digital value from the first analog signal;
the second converter is configured to sample a second digital value from the first analog signal; and
the digital signal processor is further configured to calibrate the first offset based on the first digital value, and calibrate the second offset based on a difference between the first digital value and the second digital value, and
in the second operation,
the first converter is configured to sample a third digital value from the second analog signal;
the second converter is configured to sample a fourth digital value from the second analog signal; and
the digital signal processor is further configured to calibrate the third offset based on a sum of the third digital value and the fourth digital value.

4. The receiver device according to claim 1, wherein
the first operation is performed prior to the second operation.

5. A communication system comprising:
the receiver device as recited in claim 1; and
a transmitter device configured to transmit the analog signal to the receiver device.

6. The communication system according to claim 5, wherein
in the first operation, the transmitter device is configured to select a random signal having a pattern length coprime to a number of the plurality of converters as the first analog signal.

7. The communication system according to claim 6, wherein
the transmitter device is configured to receive the number of the plurality of converters or a prime number regarding the number of the plurality of converters from the receiver device.

8. The communication system according to claim 5, wherein the digital signal processor is further configured to:

perform no calibration of the third offset in the first operation; and perform no calibration of the first offset and no-calibration of the second offset in the second operation.

9. The communication system according to claim 5, wherein in the first operation, the first converter is configured to sample a first digital value from the first analog signal, the second converter is configured to sample a second digital value from the first analog signal, and the digital signal processor is further configured to calibrate the first offset based on the first digital value, and calibrate the second offset based on a difference between the first digital value and the second digital value, and in the second operation, the first converter is configured to sample a third digital value from the second analog signal, the second converter is configured to sample a fourth digital value from the second analog signal, and the digital signal processor is further configured to calibrate the third offset based on a sum of the third digital value and the fourth digital value.

10. The communication system according to claim 5, wherein the first operation is performed prior to the second operation.

11. A reception method for use in a receiver device comprising a plurality of converters including a first converter and a second converter, each of the plurality of converters being configured to sample a digital value from an analog signal, each digital value being sampled at different timing, the reception method comprising:

performing to calibrate a first offset caused in the first converter and a second offset caused in the second converter, in a first operation using a first analog signal that is input to the first converter and the second converter; and performing to calibrate a third offset that is caused commonly in the first converter for which the first offset is calibrated and the second converter for which the second offset is calibrated, in a second operation using a second analog signal that is different from the first analog signal, the second analog signal being input to the first converter and the second converter after the first operation, wherein the first analog signal includes a random signal, the second analog signal includes a data signal different from the random signal, and a pattern length of the random signal and a number of the plurality of converters are coprime.

12. The reception method according to claim 11, further comprising:

performing no calibration of the third offset in the first operation; and performing no calibration of the first offset and no calibration of the second offset in the second operation.

13. The reception method according to claim 11, further comprising:

in the first operation, calibrating the first offset based on a first digital value sampled from the first analog signal by the first converter, and calibrating the second offset based on a difference between the first digital value and a second digital value sampled from the first analog signal by the second converter; and in the second operation, calibrating the third offset based on a sum of a third digital value sampled from the second analog signal by the first converter and a fourth digital value sampled from the second analog signal by the second converter.

14. The reception method according to claim 11, wherein the first operation is performed prior to the second operation.

\* \* \* \* \*